(12) United States Patent
Tsai et al.

(10) Patent No.: US 9,368,454 B2
(45) Date of Patent: Jun. 14, 2016

(54) SEMICONDUCTOR DEVICE WITH SHIELDING LAYER IN POST-PASSIVATION INTERCONNECT STRUCTURE

(71) Applicant: TAIWAN SEMICONDUCTOR MANUFACTURING CO., LTD., Hsinchu (TW)

(72) Inventors: Chung-Hao Tsai, Changhua County (TW); Wei-Chih Lai, Hsinchu (TW); Chuei-Tang Wang, Taichung (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 58 days.

(21) Appl. No.: 14/050,628

(22) Filed: Oct. 10, 2013

(65) Prior Publication Data

US 2015/0102472 A1 Apr. 16, 2015

(51) Int. Cl.
*H01L 23/552* (2006.01)
*H01L 23/522* (2006.01)
*H01L 23/532* (2006.01)
H01L 23/00 (2006.01)
H01L 23/31 (2006.01)
H01L 23/525 (2006.01)

(52) U.S. Cl.
CPC .......... *H01L 23/552* (2013.01); *H01L 23/5225* (2013.01); *H01L 23/5329* (2013.01); *H01L 23/3114* (2013.01); *H01L 23/3192* (2013.01); H01L 23/525 (2013.01); H01L 24/02 (2013.01); H01L 24/05 (2013.01); H01L 24/13 (2013.01); H01L 2224/0239 (2013.01); H01L 2224/02311 (2013.01); H01L 2224/02331 (2013.01); H01L 2224/02377 (2013.01); *H01L 2224/02379* (2013.01); *H01L 2224/02381* (2013.01); *H01L 2224/0401* (2013.01); *H01L 2224/05569* (2013.01); *H01L 2224/05572* (2013.01); *H01L 2224/131* (2013.01)

(58) Field of Classification Search
CPC ................... H01L 2924/14; H01L 2924/3025; H01L 24/82; H01L 24/11; H01L 2224/05548; H01L 2224/05569; H01L 27/124; H01L 27/1259; H01L 23/552; H01L 23/5225; H01L 23/5329; H01L 24/02
USPC .......................................................... 257/659
See application file for complete search history.

(56) References Cited

U.S. PATENT DOCUMENTS

| 4,776,087 A | 10/1988 | Cronin et al. |
| 5,594,279 A | 1/1997 | Itou et al. |
| 2006/0267198 A1* | 11/2006 | Lin et al. ........................ 257/750 |

(Continued)

*Primary Examiner* — Wael Fahmy
*Assistant Examiner* — Sarah Salerno
(74) *Attorney, Agent, or Firm* — McDermott Will & Emery LLP

(57) ABSTRACT

A semiconductor device includes a semiconductor substrate, a dielectric layer, a passivation layer, a protective layer, a post-passivation interconnect (PPI) structure, and a shielding layer. The semiconductor substrate has electrical circuitry. The dielectric layer is formed on the semiconductor substrate. The passivation layer is formed on the dielectric layer. The first protective layer is formed on the passivation layer. The PPI structure is disposed on the first protective layer and has a signal line and a ground line. The shielding layer is disposed over the semiconductor substrate and between the signal line and the electrical circuitry. The shielding layer is substantially equi-potentially connected to the ground line of the PPI structure.

15 Claims, 8 Drawing Sheets

(56) References Cited

U.S. PATENT DOCUMENTS

| | | | |
|---|---|---|---|
| 2009/0026608 A1* | 1/2009 | Tsai et al. | 257/737 |
| 2009/0283877 A1* | 11/2009 | Tsai et al. | 257/659 |
| 2011/0068433 A1* | 3/2011 | Kim | H01L 23/552 257/531 |
| 2011/0084399 A1 | 4/2011 | Furumiya et al. | |
| 2012/0013019 A1* | 1/2012 | Sakamoto | H01L 23/5225 257/774 |
| 2013/0166805 A1* | 6/2013 | Osagawa | 710/267 |
| 2013/0168805 A1* | 7/2013 | Yu et al. | 257/528 |

* cited by examiner

SEMICONDUCTOR DEVICE WITH SHIELDING LAYER IN POST-PASSIVATION INTERCONNECT STRUCTURE

BACKGROUND

Integrated circuits are made up of a number of active devices and passive devices. These devices are further interconnected together to form a functional circuit. Typical interconnect structures include lateral interconnections such as metal lines, and vertical interconnections such as via contacts. The density of active and passive devices in modern integrated circuits is significantly increased, and therefore the amount of interconnections is increased. Currently, wafer level chip scale packaging (WLCSP) is widely used because of its relatively simple processes. In a typical WLCSP, post-passivation interconnect (PPI) lines are formed over passivation layers which cover and protect integrated circuits. When the amount of interconnections is increased, the PPI lines in WLCSP become more complex.

BRIEF DESCRIPTION OF THE DRAWINGS

The disclosure can be more fully understood by reading the following detailed description of the embodiments, with reference made to the accompanying drawings as follows:

FIG. 14b shows a comparison of the transmission loss of the embodiment and the comparative example in connection with FIG. 14a.

DETAILED DESCRIPTION

Figure 1:
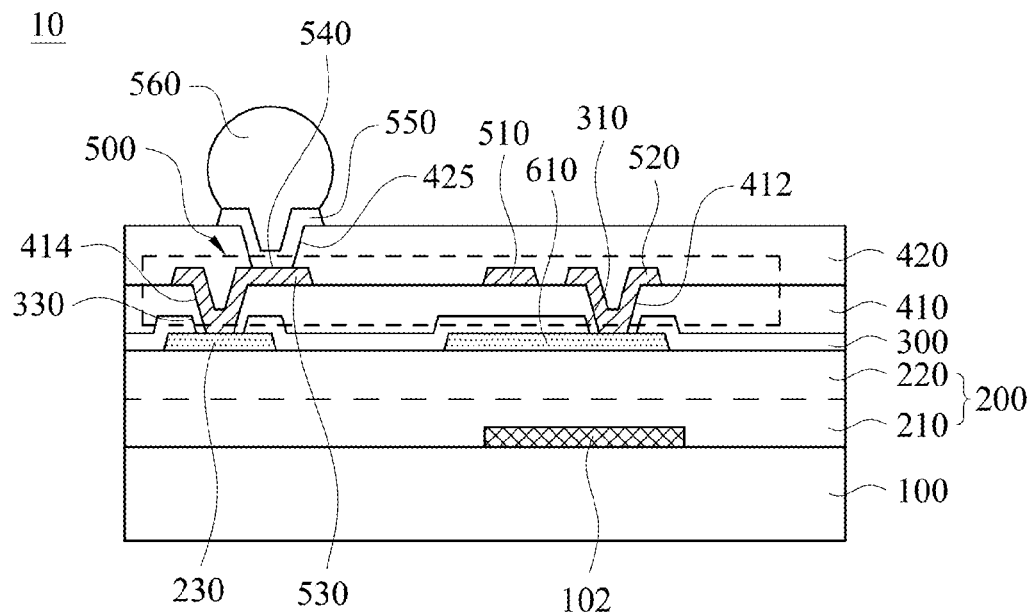
FIG. 1 is a cross-sectional view schematically illustrating a semiconductor device according to various embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In the drawings, the thickness and width of layers and regions may be exaggerated for clarity. Like reference numerals in the drawings denote like elements. The elements and regions illustrated in the figures are schematic in nature, and thus relative sizes or intervals illustrated in the figures are not intended to limit the scope of the present disclosure.

The present disclosure relates generally to semiconductor devices with a post-passivation interconnect (PPI) structure in a wafer level chip scale package (WLCSP). Specific examples of components and arrangements are described below to simplify the present disclosure. These are, of course, merely examples and are not intended to be limiting. For instance, the formation of a first feature over or on a second feature in the description may include embodiments in which the first and second features are formed in direct contact, and may also include embodiments in which additional features may be formed between the first and second features, such that the first and second features may not be in direct contact. Additionally, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "beneath," "above," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a cross-sectional view schematically illustrating a semiconductor device 10 according to various embodiments of the present disclosure. The semiconductor device 10 includes a semiconductor substrate 100, a dielectric layer 200, a passivation layer 300, a first protective layer 410, a post-passivation interconnect (PPI) structure 500, and a first shielding layer 610.

The semiconductor substrate 100 includes electrical circuitry 102 formed therein or thereon. The semiconductor substrate 100 may include, for example, a bulk silicon wafer, a semiconductor-on-insulator (SOI) substrate or a silicon germanium substrate. The electrical circuitry 102 may be any type of circuitry suitable for a particular application. For example, the electrical circuitry 102 may include electrical devices such as N-type metal-oxide semiconductor (NMOS), P-type metal-oxide semiconductor (PMOS) and/or complementary metal-oxide semiconductor (CMOS) devices, such as transistors, capacitors, diodes, photo-diodes, and the like. Persons skilled in the art will appreciate that the above examples are provided for illustrative purposes only to further explain applications of some illustrative embodiments and are not meant to limit the disclosure in any manner. Other circuitry may be used as appropriate for a given application.

The dielectric layer 200 is formed over the semiconductor substrate 100, as shown in FIG. 1. The dielectric material may be formed, for example, of a low-k dielectric material. Suitable materials for the dielectric layer 200 include, but are not limited to, phosphosilicate glass (PSG), borophosphosilicate glass (BPSG), fluorinated silicate glass (FSG), silicon carbon oxide ($SiC_xO_y$), silicon carbon material, polymeric material, and the like. Any suitable method may be employed to form the dielectric layer 200. For example, spin coating techniques, chemical vapor deposition (CVD) techniques, plasma-enhanced CVD (PECVD) techniques, and the like may be utilized.

In some embodiments, the dielectric layer 200 includes an inter-layer dielectric (ILD) layer 210. Contacts (not shown)

are formed through the IDL layer 210 to provide electrical connection to the electrical circuitry 102. The contact in the IDL layer 210 is formed of metallic material, such as TaN, Ta, TiN, Ti, CoW, copper, tungsten, aluminum, silver or a combination thereof.

In some embodiments, the dielectric layer 200 includes an inter-metal dielectric (IMD) layer 220 formed over the IDL layer 210. In one example, the IMD layer 220 has a multiple-layered structure, and a plurality of metal layers (not shown in FIG. 1) are formed in the IMD layer 220 to interconnect the elements of the electrical circuitry 102 and provide an external electrical connection. In general, a number of via contacts (not shown in FIG. 1) are formed between two of the metal layers to provide electrical connection therebetween. The IMD layer 220 includes PSG formed by PECVD or high-density plasma CVD (HDPCVD), or the like.

In some embodiments, at least one contact pad 230 is formed on the dielectric layer 200, and the contact pad 230 is electrically coupled to the electrical circuitry 102 through the metal layer and the contact buried in the dielectric layer 200. The contact pad 230 is formed of aluminum, aluminum copper, aluminum alloys, copper or copper alloys, for example. The contact pad 230 is configured to electrically connect the electrical circuitry 102 to the post-passivation interconnect (PPI) structure 500.

The PPI structure 500 may include signal lines, ground lines, capacitors, fan-in lines, fan-out lines and/or a redistribution layer structure having signal lines, ground lines and re-distribution lines. As shown in FIG. 1, the PPI structure 500 includes a signal line 510 and a first ground line 520 spaced apart from the signal line 510. The first ground line 520 is coupled to a ground voltage, but the signal line 510 is configured to transmit a voltage signal or a current signal other than the ground signal. In some embodiments, the PPI structure 500 further includes one or more re-distribution lines, such as re-distribution line 530, which are electrically connected to the signal line 510 or the first ground line 520. The signal line 510, the first ground line 520 and the re-distribution line 530 include copper, aluminum, copper alloy, or other conductive materials formed using plating, electroless plating, sputtering, chemical vapor deposition methods, for example.

As shown in FIG. 1, the first shielding layer 610 is formed on the dielectric layer 200 to shield off electrical coupling or interference from the PPI structure 500, and thus the first shielding layer 610 secures the electrical circuitry 102 against the interference from the PPI structure 500. Specifically, the first shielding layer 610 is substantially equi-potentially connected to the first ground line 520 of the PPI structure 500, and therefore the first shielding layer 610 is coupled to a ground voltage. Furthermore, the first shielding layer 610 is positioned between the signal line 510 and the electrical circuitry 102, and accordingly the first shielding layer 610 shields the electrical circuitry 102 from the electrical coupling or interference caused by the signal line 510 and/or the re-distribution line 530 of the PPI structure 500. In one example, the first shielding layer 610 overlaps the signal line 510 of the PPI structure when viewed in a direction perpendicular to the first shielding layer 610. In another example, the first shielding layer 610 overlaps the electrical circuitry 102 when viewed in a direction perpendicular to the first shielding layer 610. In still another example, the area of the first shielding layer 610 is greater than that of the signal line 510.

In one example, the first shielding layer 610 and the contact pad 230 are formed in a single photolithography process. In particular, the first shielding layer 610 and the contact pad 230 are deposited in a single deposition process, and the deposited layer is further patterned to form both the first shielding layer 610 and the contact pad 230 in a signal photolithography process. Therefore, the first shielding layer 610 and the contact pad 230 include the same material according to one example of the present disclosure. In addition, the first shielding layer 610 extends on a level the same as the contact pad 230. The first shielding layer 610 is spaced apart from the contact pad 230, and thus the first shielding layer 610 and the contact pad 230 are electrically independent of each other according to another example of the present disclosure.

It is noted that the first shielding layer 610 may be disposed at any position between the signal line 510 and the electrical circuitry 102 although the first shielding layer 610 depicted in FIG. 1 is formed on the dielectric layer 200. Other arrangements and features of the shielding layer are described in detail hereinafter.

With reference to FIG. 1, the passivation layer 300 is disposed over the dielectric layer 200, and covers a portion of the first shielding layer 610. In one example, the passivation layer 300 is patterned to form one or more openings, such as first opening 310, exposing a portion of the first shielding layer 610. The first opening 310 allows the first shielding layer 610 to be connected to the ground line 520 of the PPI structure 500. In addition, suitable materials for the passivation layer 300 include, but are not limited to, undoped silicate glass (USG), silicon nitride, silicon oxide, silicon oxynitride, and a non-porous material formed by CVD, PVD, or the like. Furthermore, the passivation layer 300 may have a single-layered structure or a multiple-layered structure. A skilled person in the art will appreciate that a single layer of passivation layer and contact pad are shown for illustrative purposes only. As such, some embodiments may include a plurality of passivation layers and/or a plurality of layers of contact pads.

The first protective layer 410 is formed over the passivation layer 300. In some embodiments, the first protective layer 410 has a second opening 412 through which at least a portion of the first shielding layer 610 is exposed. In particular, the second opening 412 overlaps at least a portion of the first opening 310. Therefore, the first shielding layer 610 may be substantially equi-potentially connected to the first ground line 520 through the first opening 310 and the second opening 412. The first protective layer 410 may be made of, for example, a polymeric material such as benzocyclobutene (BCB), polybenzoxazole (PBO), polyimide, epoxy, and the like.

In some embodiments, the passivation layer 300 and the first protective layer 410 respectively have a third opening 330 and a fourth opening 414, which overlaps at least a portion of the third opening 330. The third opening 330 and the fourth opening 414 are positioned on the contact pad 230, and thereby exposing a portion of the contact pad 230. The exposed portion of the contact pad 230 serves as a contact to the PPI structure 500.

In some embodiments, the semiconductor device 10 further includes a second protective layer 420 formed over the PPI structure 500. The second protective layer 420 covers the exposed portions of the first protective layer 410 as well. The second protective layer 420 has an opening 425 exposing a pad region 540 of the PPI structure 500, on which an under-bump metallurgy (UBM) layer 550 is formed. Furthermore, a solder ball 560 may be formed on and electrically connected to the UBM layer 550. In one example, the second protective layer 420 may be made of a polymeric material such as polybenzoxazole (PBO), benzocyclobutene (BCB), polyimide, epoxy, and the like. In some examples, the second protective layer 420 is formed of a non-organic material such as undoped silicate glass (USG), silicon nitride, silicon oxynitride, silicon oxide, and the like.

FIGS. 2-13 are cross-sectional views schematically illustrating semiconductor devices 10a, 10b, 10c, 10d, 10e, 10f, 10g, 10h, 10i, 10j, 10k, and 10p according to various embodiments of the present disclosure. In FIGS. 2-13, the same or similar features are identified by the same reference numerals. These features are the same as or similar to like-numbered features described with respect to FIG. 1. Therefore, the description will be omitted to avoid repetition.

Figure 2:
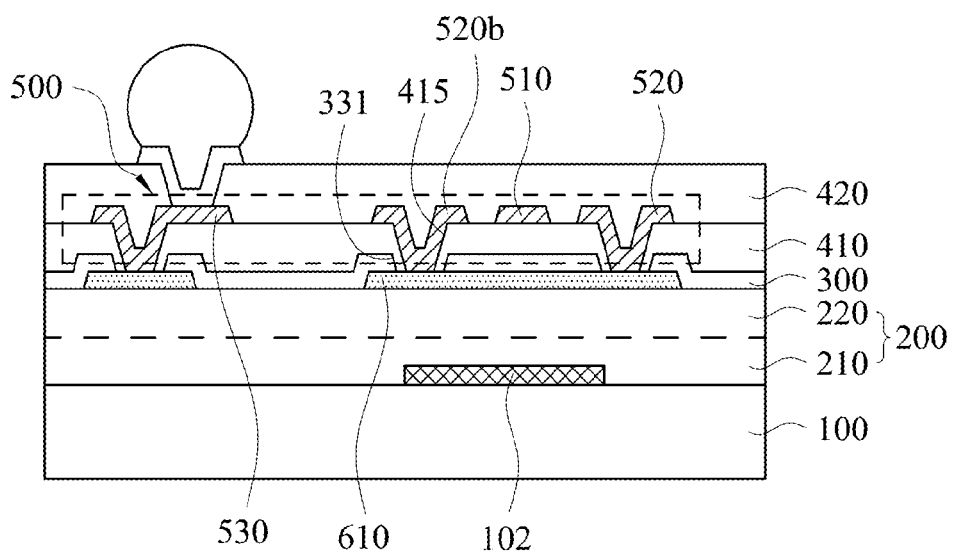
FIGS. 2-13 are cross-sectional views schematically illustrating semiconductor devices according to various embodiments of the present disclosure.

As shown in FIG. 2, the PPI structure 500 of the semiconductor device 10a further includes a second ground line 520b. The second ground line 520b is substantially equi-potentially connected to the first shielding layer 610. For instance, the first shielding layer 610 may be connected to the second ground line 520b through the openings, such as opening 331 and opening 415 respectively formed in the passivation layer 300 and the first protective layer 410. It is noted that the first ground line 520 and the second ground line 520b are respectively formed on opposite sides of the signal line 510. In other words, the signal line 510 is positioned between the first ground line 520 and the second ground line 520b. In this arrangement, the electrical coupling between the signal line 510 and the re-distribution line 530 may be suppressed by the second ground line 520b.

Figure 3:
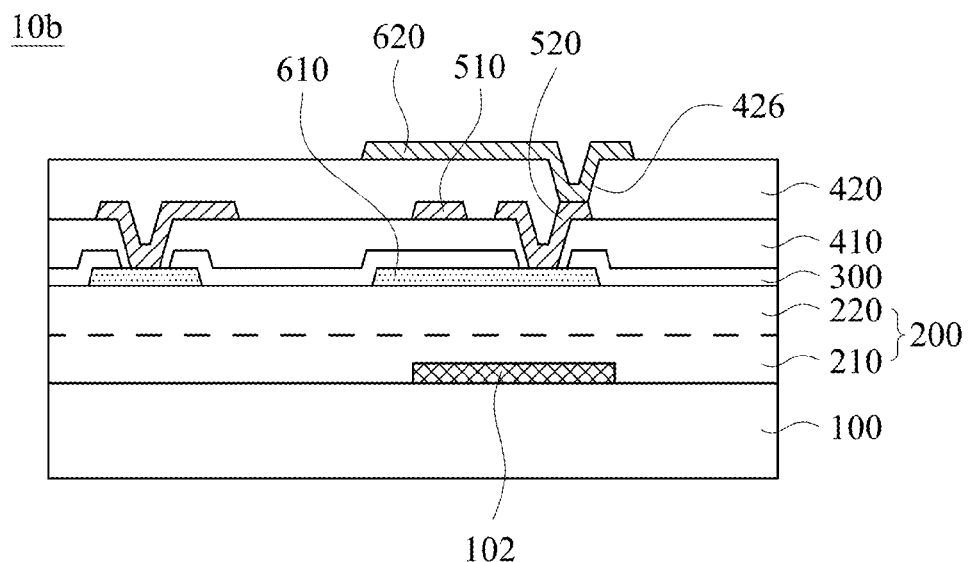

Referring to FIG. 3, the semiconductor device 10b further includes a second shielding layer 620 formed on the second protective layer 420. The second shielding layer 620 is substantially equi-potentially connected to the first ground line 520. For instance, the second protective layer 420 may have an opening 426 exposing a portion of the first ground line 520, and the second shielding layer 620 is in contact with the first ground line 520 through the opening 426. Furthermore, the second shielding layer 620 extends horizontally and overlaps the signal line 510 and the first shielding layer 610. Other protective layers (not shown in FIG. 3) and/or redistribution circuits (not shown in FIG. 3) may be formed over the second shielding layer 620 and the second protective layer 420. The second shielding layer 620 shields the redistribution circuits positioned thereabove from the electrical interference due to electrical signals on the signal line 510.

Figure 4:
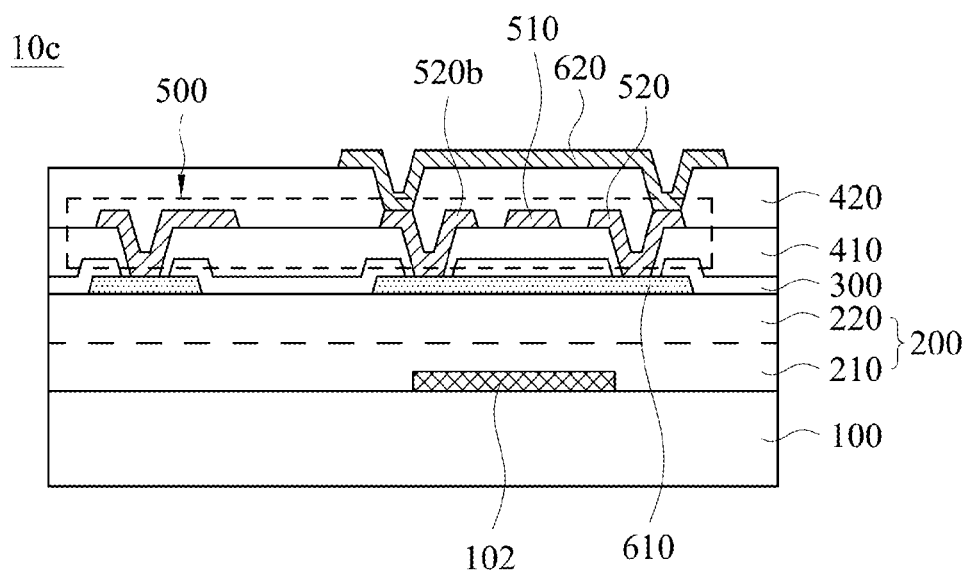

Referring to FIG. 4, the semiconductor device 10c further includes a second ground line 520b and a second shielding layer 620. The second shielding layer 620 is formed on the second protective layer 420. The second ground line 520b is formed on the first protective layer 410, and is substantially equi-potentially connected to both the first shielding layer 610 and the second shielding layer 620. Similarly, the first ground line 520 is substantially equi-potentially connected to the first and second shielding layers 610, 620. The signal line 510 is positioned between the first ground line 520 and the second ground line 520b, and further the signal line 510 is positioned between the first shielding layer 610 and the second shielding layer 620. Furthermore, the second shielding layer 620 overlaps both of the first shielding layer 610 and the signal line 510. One skilled in the art will appreciate that other protective layers (not shown in FIG. 4) and/or redistribution circuits (not shown in FIG. 4) may be formed over the second shielding layer 620 and second protective layer 420.

Figure 5:
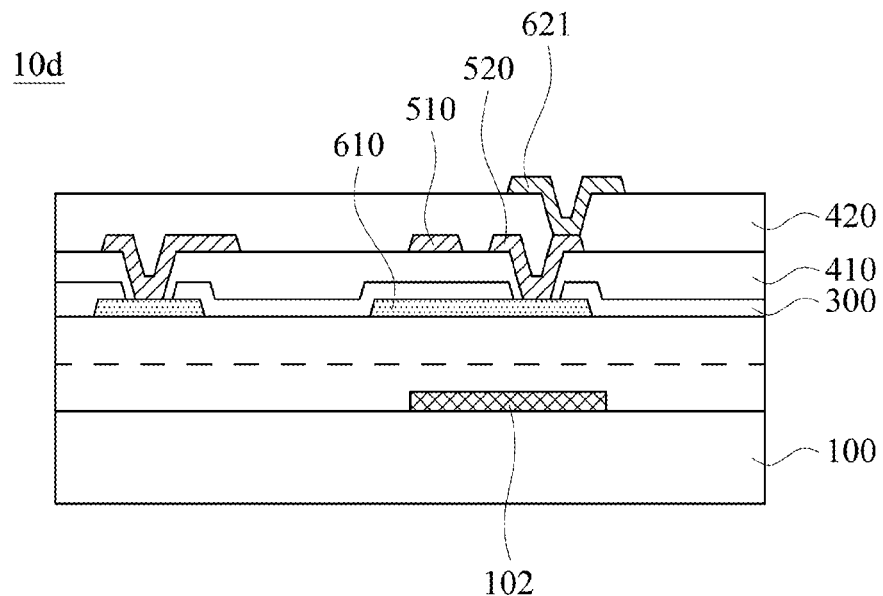

With reference to FIG. 5, the semiconductor device 10d is similar to the semiconductor device 10b shown in FIG. 3, except that the second shielding layer 620 is replaced by a ground line 621 formed on the second protective layer 420. Both the ground line 621 and the first ground line 520 are coupled to a ground voltage or a ground signal. In embodiments, the ground line 621 overlaps the first ground line 520.

Figure 6:
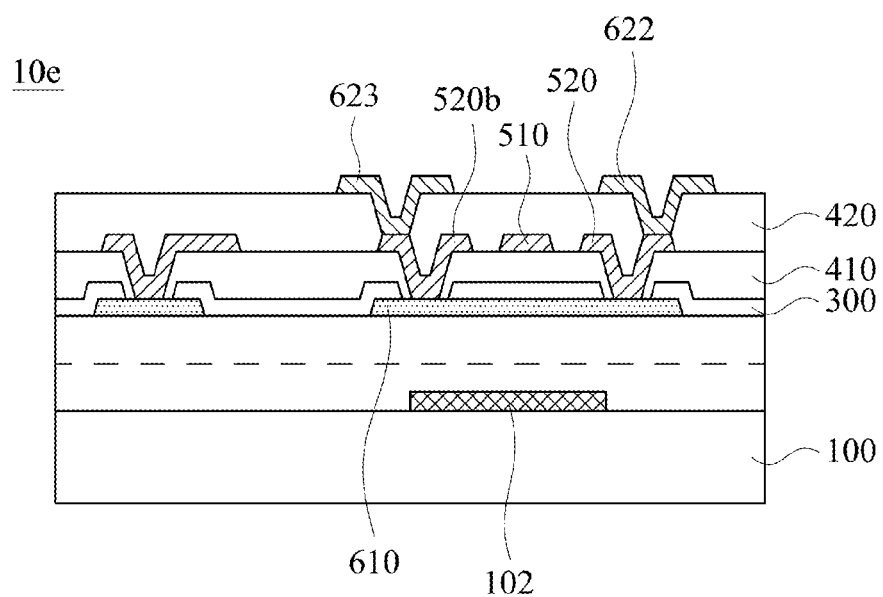

With reference to FIG. 6, the semiconductor device 10e is similar to the semiconductor device 10c shown in FIG. 4, except that the second shielding layer 620 is replaced by two ground lines 622, 623 formed on the second protective layer 420. The ground line 622 is spaced apart from the ground line 623. Furthermore, the ground lines 622, 623 are respectively coupled to the first ground line 520 and the second ground line 520b.

Figure 7:
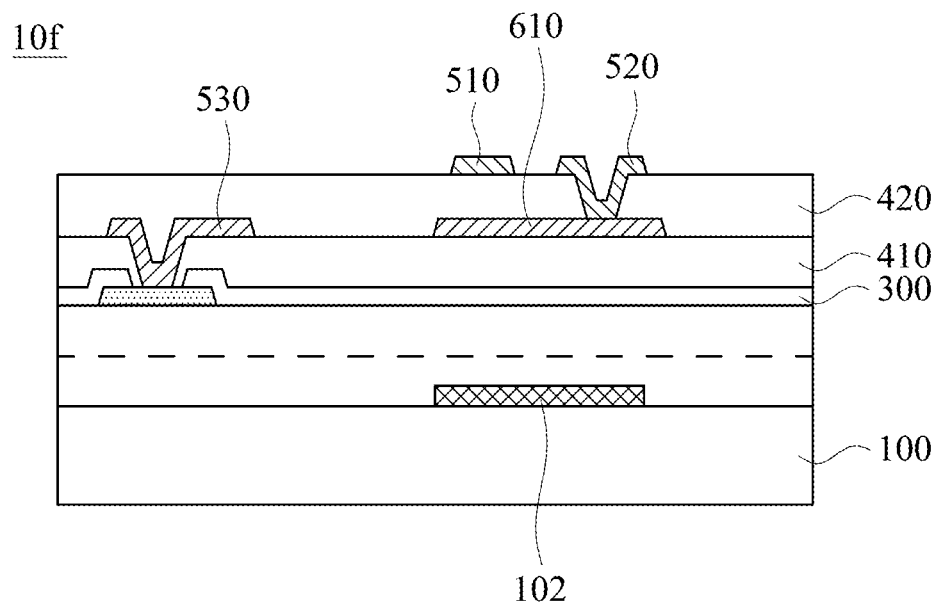

Referring to FIG. 7, the semiconductor device 10f is characterized in that the first shielding layer 610 is formed on the first protective layer 410. Furthermore, both the signal line 510 and the first ground line 520 are formed on the second protective layer 420. A portion of the PPI structure, such as the signal line 510 and the first ground line 520, is formed on the second protective layer 420 whereas another portion of the PPI structure, such as the re-distribution line 530, is formed between the first and second protective layers 410, 420. In some embodiments, the first shielding layer 610 is formed of a material the same as the re-distribution line 530. The first shielding layer 610 is spaced apart from the re-distribution line 530, and extends on the same level as the re-distribution line 530.

Figure 8:
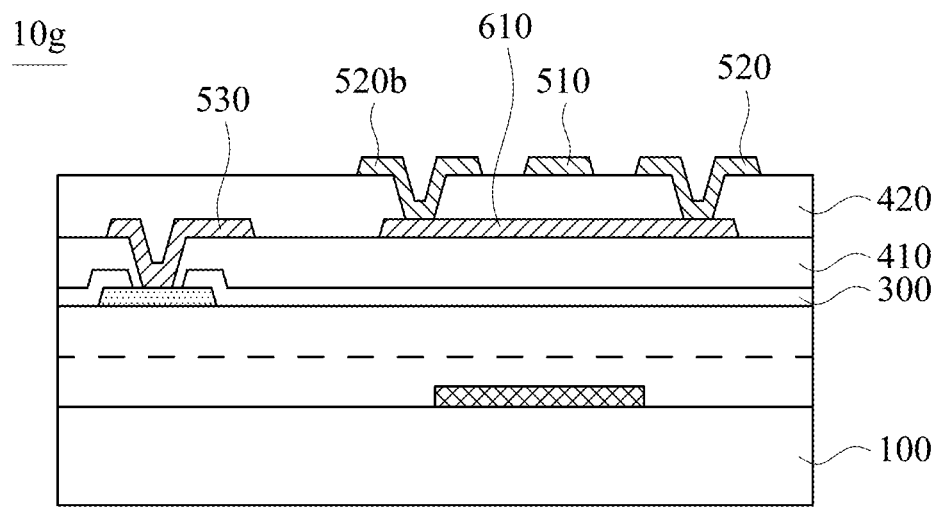

Referring to FIG. 8, the semiconductor device 10g is similar in structure to the semiconductor device 10f shown in FIG. 7, except that the semiconductor device 10g further includes a second ground line 520b formed on the second protective layer 420, in which the signal line 510 is arranged between the first and second ground lines 520, 520b. The first shielding layer 610 is substantially equi-potentially connected to the first and second ground lines 520, 520b.

Figure 9:
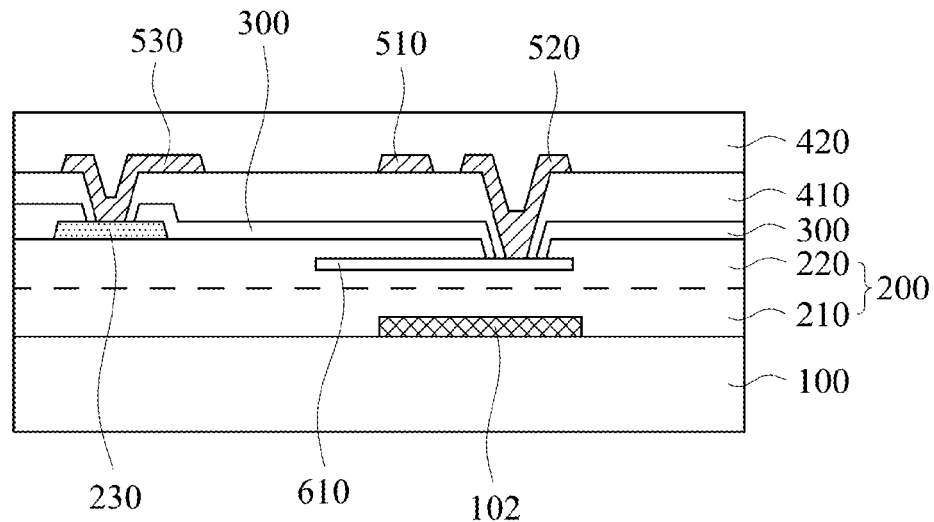

Referring to FIG. 9, the semiconductor device 10h is characterized in that the first shielding layer 610 is buried in the dielectric layer 200 over the semiconductor substrate 100. In some embodiments, the first shielding layer 610 is buried in the inter-metal dielectric (IMD) layer 220. Furthermore, the IMD layer 220, the passivation layer 300, and the first protective layer 410 may be patterned to form one or more openings or vias through which the first shielding layer 610 is connected to the first ground line 520. In yet some embodiments, the first shielding layer 610 may be formed in the inner-layer dielectric (ILD) layer 210 although the first shielding layer 610 depicted in FIG. 9 is formed in the IMD layer 220.

Figure 10:
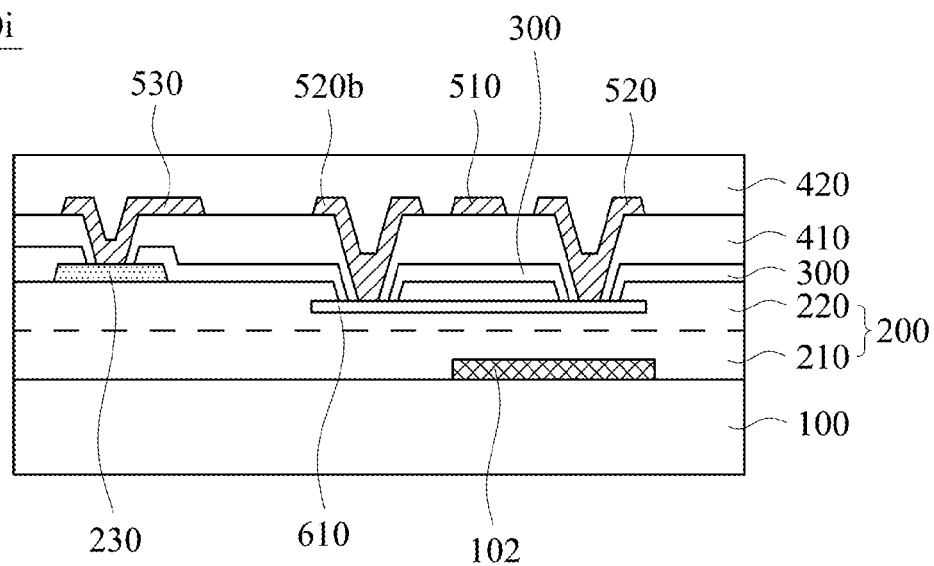

Referring to FIG. 10, the semiconductor device 10i is similar in structure to the semiconductor device 10h shown in FIG. 9, except that the semiconductor device 10i further includes a second ground line 520b formed on the first protective layer 410, in which the signal line 510 is arranged between the first and second ground lines 520, 520b. The first shielding layer 610 is substantially equi-potentially connected to the first and second ground lines 520, 520b.

Figure 11:
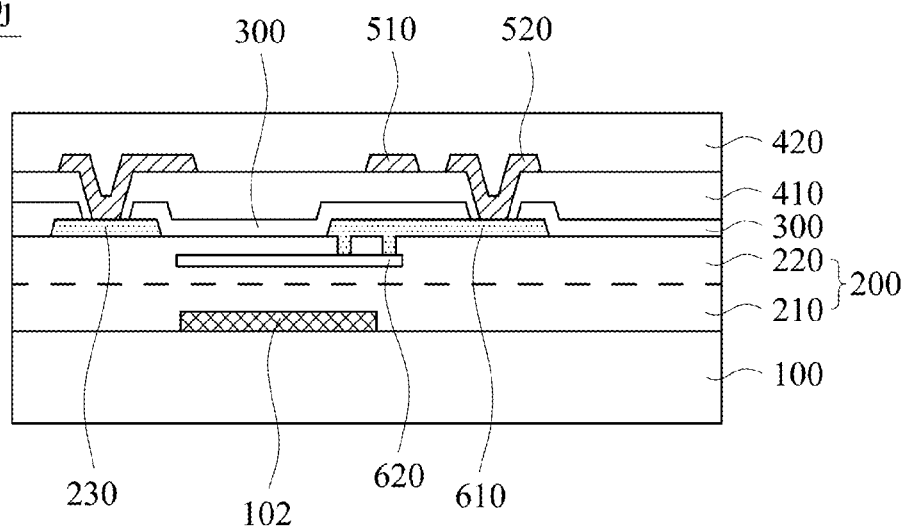

Referring to FIG. 11, the semiconductor device 10j is characterized in that the first shielding layer 610 is formed on the dielectric layer 200 whereas the second shielding layer 620 is buried in the IMD layer 220 of the dielectric layer 200. The second shielding layer 620 may be connected to the first shielding layer 610 through one or more openings or vias formed in the IMD layer 220. In some embodiments, the second shielding layer 620 merely overlaps a portion of the first shielding layer 610, and extends in a direction opposite to the extension direction of the first shielding layer 610. Therefore, the effective shielding area may be increased compared to other approaches. Furthermore, the first and second shielding layers 610, 620 are formed on different layers and thereby providing excellent flexibility for circuit design. In yet some embodiments, the second shielding layer 620 may completely overlap the first shielding layer 610.

Figure 12:
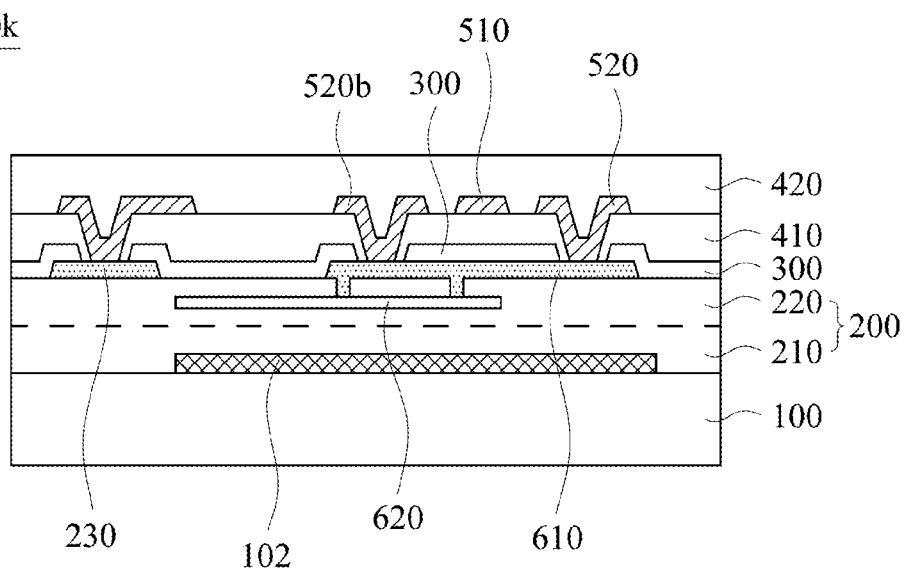

With reference to FIG. 12, the semiconductor device 10k is similar in structure to the semiconductor device 10j shown in FIG. 11, except that the semiconductor device 10k further includes a second ground line 520b formed on the first protective layer 410, in which the signal line 510 is arranged between the first ground line 520 and the second ground line 520b. The second ground line 520b is substantially equi-potentially connected to the first shielding layer 610.

Figure 13:
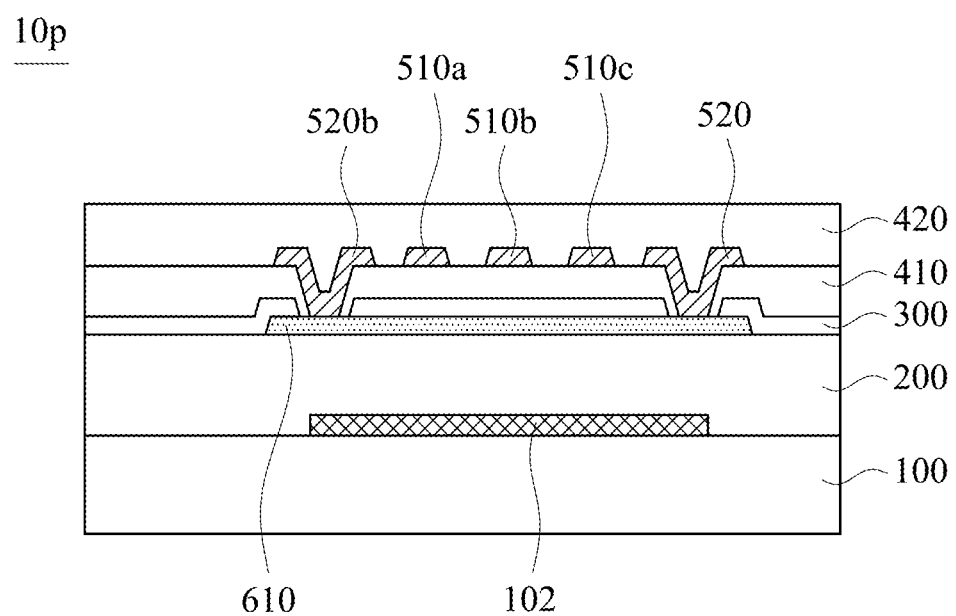

Referring to FIG. 13, the semiconductor device 10p includes a first ground line 520, a second ground line 520b and a plurality of signal lines 510a, 510b, 510c. The signal lines 510a, 510b, 510c are arranged between the first and second ground lines 520, 520b. The first shielding layer 610 is formed on the dielectric layer 200, and is equi-potentially connected to the first and second ground lines 520, 520b. The first shielding layer 610 is interposed between the electrical circuitry 102 and the signal lines 510a, 510b, 510c. Furthermore, the first shielding layer 610 overlaps the signal lines 510a, 510b, 510c and the electrical circuitry 102 to shield off the electrical coupling from the signal lines 510a, 510b, 510c.

Figure 14A:
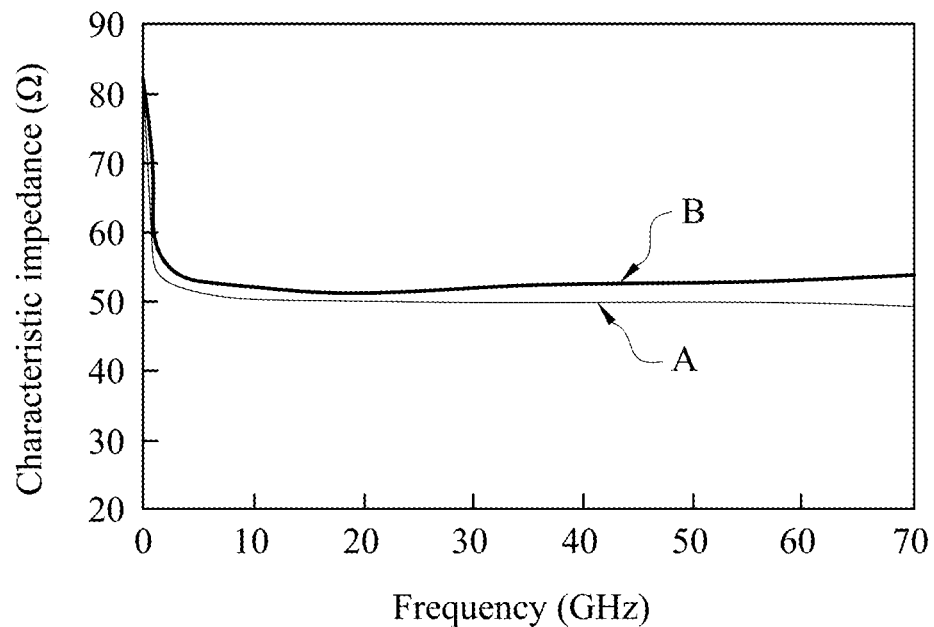
FIG. 14a is a graph showing characteristic impedances of a comparative example and an embodiment of the present disclosure.
Figure 14B:
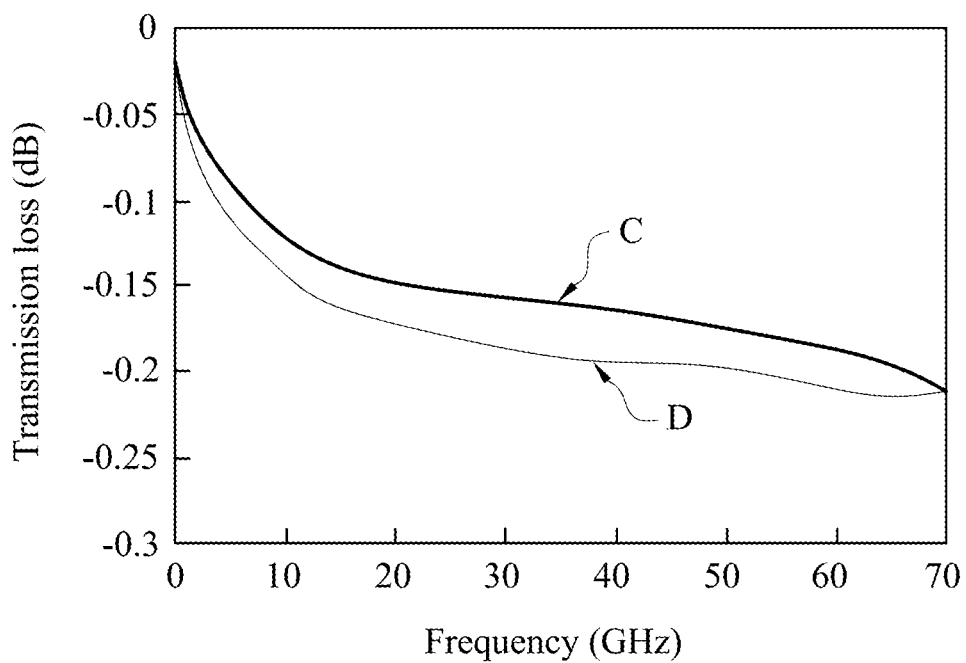

FIG. 14a is a graph showing characteristic impedances of a semiconductor device of a comparative example and a semiconductor device in accordance with certain embodiments of the present disclosure. The comparative example does not include any shielding layer. In FIG. 14a, curve A and curve B respectively represent the embodiments and the comparative example. It may be observed that the curve A is similar to curve B. Significantly, FIG. 14b shows a comparison of the transmission loss of the semiconductor device according to the embodiments and the semiconductor device of the comparative example in connection with FIG. 14a. In FIG. 14b, curves C, D respectively represent the embodiments and the comparative example. It may be observed that the transmission loss of the semiconductor device according to the embodiments is smaller than that of the comparative example although the characteristic impedance of the semiconductor device according to the embodiments is substantially the same as that of the comparative example. Accordingly, the semiconductor device according to the embodiments of the present disclosure may provide a better electrical performance as compared to prior art.

In accordance with one aspect of some embodiments, a semiconductor device includes a semiconductor substrate, a dielectric layer overlying the semiconductor substrate, a first shielding layer overlying the dielectric layer, a passivation layer overlying the first shielding layer and the dielectric layer, a first protective layer overlying the passivation layer, and a post-passivation interconnect (PPI) structure overlying the first protective layer. The passivation layer has a first opening positioned above the first shielding layer. The first protective layer has a second opening overlapped with the first opening such that a portion of the first shielding layer is exposed. The PPI structure includes at least one signal line and at least one ground line. The ground line is in contact with the exposed portion of the first shielding layer. Furthermore, the signal line overlaps the first shielding layer.

In accordance with another aspect of some embodiments, a semiconductor device includes a semiconductor substrate, a passivation layer overlying the semiconductor substrate, a shielding layer overlying the first polymeric layer, a second polymeric layer covering the shielding layer, and a redistribution layer (RDL) structure overlying the second polymeric layer. The substrate includes an electrical circuitry having a contact pad. The second polymeric layer has an opening exposing a portion of the shielding layer. The RDL structure includes a signal line and a ground line spaced apart from the signal line. The signal line is electrically connected to the contact pad. The ground line is in contact with the exposed portion of the shielding layer, and the shielding layer laterally extends past an edge of the signal line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
    a semiconductor substrate comprising electrical circuitry, an inter-metal dielectric layer over the electrical circuitry, and a contact pad formed on and in contact with the inter-metal dielectric layer;
    a passivation layer overlying the inter-metal dielectric layer;
    a first protective layer overlying the passivation layer;
    a post-passivation interconnect (PPI) structure overlying the first protective layer and comprising at least one signal line and a first ground line spaced apart from the signal line;
    a first shielding layer interposed between the inter-metal dielectric layer and the passivation layer, wherein the first shielding layer extends on and in contact with the inter-metal dielectric layer such that the first shielding layer is between the signal line and the electrical circuitry, and the first shielding layer is substantially equi-potentially connected to the first ground line of the PPI structure;
    a second protective layer covering the PPI structure and in contact with the first protective layer, wherein both the first and the second protective layers are made of polymeric material; and
    a second shielding layer formed over and in contact with the second protective layer, wherein the second shielding layer overlaps the first shielding layer and is physically connected to the first ground line, and wherein the signal line and the first ground line are interposed between first shielding layer and the second shielding layer.

2. The semiconductor device according to claim 1, wherein the contact pad is spaced apart from the first shielding layer, and the first shielding layer and the contact pad comprise the same material.

3. The semiconductor device according to claim 1, wherein the first shielding layer extends on the same level as and spaced apart from the contact pad.

4. The semiconductor device according to claim 1, wherein the passivation layer has a first opening exposing a portion of the first shielding layer, and the first protective layer has a second opening exposing the exposed portion of the first shielding layer.

5. The semiconductor device according to claim 4, wherein the first ground line of the PPI structure is through the first and the second openings connected to the first shielding layer on the inter-metal dielectric layer.

6. The semiconductor device according to claim 1, wherein the PPI structure further comprises a second ground line that is substantially equi-potentially connected to the first shielding layer, wherein the signal line is positioned between the first ground line and the second ground line.

7. The semiconductor device according to claim 6, wherein the signal line, the first ground line and the second ground line are formed at a same level over the semiconductor substrate.

8. The semiconductor device according to claim 1, wherein the first shielding layer overlaps the signal line and the second shielding layer.

9. The semiconductor device according to claim 1, wherein the PPI structure further comprises a second ground line that is substantially equi-potentially connected to the first shielding layer and the second shielding layer, wherein the signal line is positioned between the first ground line and the second ground line.

10. The semiconductor device according to claim 1, further comprising a third shielding layer buried in the inter-metal dielectric layer, wherein the third shielding layer is substantially equi-potentially connected to first shielding layer.

11. The semiconductor device according to claim 1, wherein the first shielding layer is buried in the inter-metal dielectric layer over the semiconductor substrate.

12. The semiconductor device according to claim 1, wherein the first shielding layer is formed on the first protective layer.

13. The semiconductor device according to claim 1, wherein each of the signal line and the first ground line comprises copper.

14. A semiconductor device, comprising:
- a semiconductor substrate comprising electrical circuitry, an inter-metal dielectric layer over the electrical circuitry, and a contact pad formed on and in contact with the inter-metal dielectric layer;
- a passivation layer disposed on and in contact with the inter-metal dielectric layer and the contact pad;
- a first protective layer covering the passivation layer and having a first opening;
- a redistribution line disposed on the first protective layer and physically in direct contact with the contact pad through the first opening;
- a first shielding layer extends on and in contact with the first protective layer, wherein the first shielding layer extends on a level that is higher the contact pad and is physically in direct contact with the contact pad, and wherein the first shielding layer and the redistribution line extend on the same level;
- a second protective layer disposed over the first shielding layer and the redistribution line; and
- a post-passivation interconnect (PPI) structure overlying the second protective layer and comprising at least one signal line and at least one ground line in contact with the first shielding layer, wherein the first shielding layer laterally extends to cover up an entire projection area of the signal line on the inter-metal dielectric layer.

15. A semiconductor device, comprising:
- a semiconductor substrate including electrical circuitry, an inter-metal dielectric layer over the electrical circuitry, and a contact pad formed on and in contact with the inter-metal dielectric layer;
- a first shielding layer extending on and in contact with the inter-metal dielectric layer;
- a passivation layer disposed on the inter-metal dielectric layer and the first shielding layer;
- a first polymeric layer overlying the passivation layer;
- a redistribution layer (RDL) structure overlying the first polymeric layer and comprising a signal line electrically connected to the contact pad and a ground line spaced apart from the signal line;
- a second polymeric layer covering the signal line and the ground line; and
- a second shielding layer extending on the second polymeric layer, wherein the first shielding layer and the second shielding layer are equi-potentially connected to the ground line, and the signal line and the ground line are sandwiched between the first and the shielding layers.

* * * * *